United States Patent
Niemirowski et al.

[19]

[11] Patent Number: 6,056,123
[45] Date of Patent: May 2, 2000

[54] SEMICONDUCTOR WAFER CARRIER HAVING THE SAME COMPOSITION AS THE WAFERS

[75] Inventors: George E. Niemirowski; Adam F. Niemirowski, both of Southlake, Tex.

[73] Assignee: Novus Corporation, Farmers Branch, Tex.

[21] Appl. No.: 09/208,324

[22] Filed: Dec. 9, 1998

Related U.S. Application Data

[60] Provisional application No. 60/069,173, Dec. 10, 1997.

[51] Int. Cl.[7] .................................................. B65D 85/90
[52] U.S. Cl. ...................... 206/711; 206/454; 206/524.6; 211/41.18; 118/500
[58] Field of Search .............................. 118/500; 206/454, 206/710, 711, 832, 833, 524.6; 211/41.18; 29/402.08, 462

[56] References Cited

U.S. PATENT DOCUMENTS

| | | | |
|---|---|---|---|
| 3,951,587 | 4/1976 | Alliegro et al. | 432/253 |
| 4,093,201 | 6/1978 | Dietze et al. | 118/500 |
| 4,318,749 | 3/1982 | Mayer | 211/41.18 |
| 4,966,549 | 10/1990 | Ohdate | 118/500 |
| 5,468,297 | 11/1995 | Letort | 206/454 |
| 5,488,558 | 1/1996 | Watanabe et al. | 118/500 |
| 5,538,230 | 7/1996 | Sibley | 206/454 |

*Primary Examiner*—Jim Foster
*Attorney, Agent, or Firm*—David H. Judson

[57] ABSTRACT

The described embodiments of the present invention provide a wafer boat that is manufactured using polysilicon. A further embodiment of the invention is a mechanical boat manufacturing technique which avoids the use of welding and other forms of bonding. Another embodiment of the present invention is a polysilicon wafer boat that is formed with a plurality of spaced parallel rods having slots for supporting a series of semi-conductor wafers in a generally edgewise, spaced, parallel position. The rods are mechanically held in place at each end by a plate and capturing mechanism. In yet another embodiment of the invention, polysilicon rods are machined to a tight tolerance with openings in end pieces of the boat. The rods are held firmly in place by polysilicon wedges. This makes for a very rigid structure. If so desired, the boat can then be coated with a layer of polysilicon in a furnace to better lock the parts together.

15 Claims, 2 Drawing Sheets

SEMICONDUCTOR WAFER CARRIER HAVING THE SAME COMPOSITION AS THE WAFERS

PRIORITY CLAIM

This application claims, under 35 U.S.C. § 119(e), the priority of provisional application Serial No. 60/069,173 filed Dec. 10, 1997.

BACKGROUND OF THE INVENTION

1. Technical Field

The present invention relates to the field of semiconductor integrated circuit fabrication. More particularly, the present invention relates to the field of equipment used in high temperature processing of integrated circuits.

2. Description of the Related Art

Integrated circuit fabrication typically involves the use of carriers, otherwise known as "boats", containing batches of wafers. These carriers are then used to transport and hold the wafers inside furnaces as well as other equipment. These carriers are usually made of special materials, such as quartz and silicon carbide, that allow them to be used at the elevated temperatures inside furnaces while the wafers are being processed. The material that these carriers are made from also impacts the quality of the wafers being processed. Some materials are not suitable because they would contaminate the wafers and render the wafers useless.

The equipment used in wafer processing must be extremely clean to avoid contamination of the wafers. Microscopic particles and very small amounts of unwanted chemicals can destroy integrated circuits. The percentage of good integrated circuits from a particular fabrication lot is known in the industry as the yield percentage. It is well known in the art that a small drop in yield can have a very large economic impact.

Human beings are one of the worst sources of contamination in a semiconductor fabrication facility. In order to minimize the contamination of the wafers, it is common to have machines load and unload the individual wafers into the boats.

These machines require strict dimensioning in order to function properly. If the carriers change dimensionally after a period of time due to the stresses of the fabrication processes, they could prove to be unusable in the wafer loading equipment.

Existing materials used for making wafer carriers have less than ideal characteristics. No matter how well a carrier using these materials is made and how clean the material, it still can contaminate the wafers. This is most often caused by impurities imbedded in the material. These impurities can 'out-gas', or release, out of the carriers during high temperature processing.

Polysilicon can be manufactured to extreme cleanliness standards, which lends itself very well to the semiconductor industry. However, it is very brittle and not easily molded. Also, making bonds to polysilicon is difficult. It cannot be easily welded nor can it be easily glued together. Most glues would constitute a source of contamination and cannot withstand the extreme conditions of integrated circuit fabrication.

Another problem with some of the existing carriers is that the material that the carriers are made from actually flows at elevated temperature. The carriers actually can change size over time at elevated temperatures. This can pose a huge problem to wafer handling automation. These carriers are also limited in their useful temperature range. In certain processes, some commonly used materials cannot be used because the carrier would deform to an unusable state rather quickly.

BRIEF SUMMARY OF THE INVENTION

Therefore, it is an object of the present invention to provide a wafer carrier having a very low level of contaminants.

It is also an object of the present invention to provide a carrier which may be fabricated using difficult materials.

Another object of the invention is to provide a wafer carrier having the same material as the semiconductor wafers.

Yet another object of the invention is to provide a wafer carrier which may be repaired if a component becomes damaged.

These and other objects of the invention are achieved in the described embodiments of the present invention wherein a wafer boat that is manufactured using polysilicon. A further embodiment of the invention is a mechanical boat manufacturing technique which avoids the use of welding and other forms of bonding.

Another embodiment of the present invention is a polysilicon wafer boat that is formed with a plurality of spaced parallel rods having slots for supporting a series of semiconductor wafers in a generally edgewise, spaced, parallel position. The rods are mechanically held in place at each end by a plate and capturing mechanism.

In yet another embodiment of the invention, polysilicon rods are machined to a tight tolerance with openings in end pieces of the boat, The rods are held firmly in place by polysilicon wedges. This makes for a very rigid structure. If so desired, the boat can then be coated with a layer of polysilicon in a furnace to better lock the parts together.

BRIEF DESCRIPTION OF THE DRAWINGS

For a more complete understanding of the present invention and the advantages thereof, reference should be made to the following Detailed Description taken in connection with the accompanying drawings in which.

DETAILED DESCRIPTION OF THE PREFERRED EMBODIMENT

Figure 1:
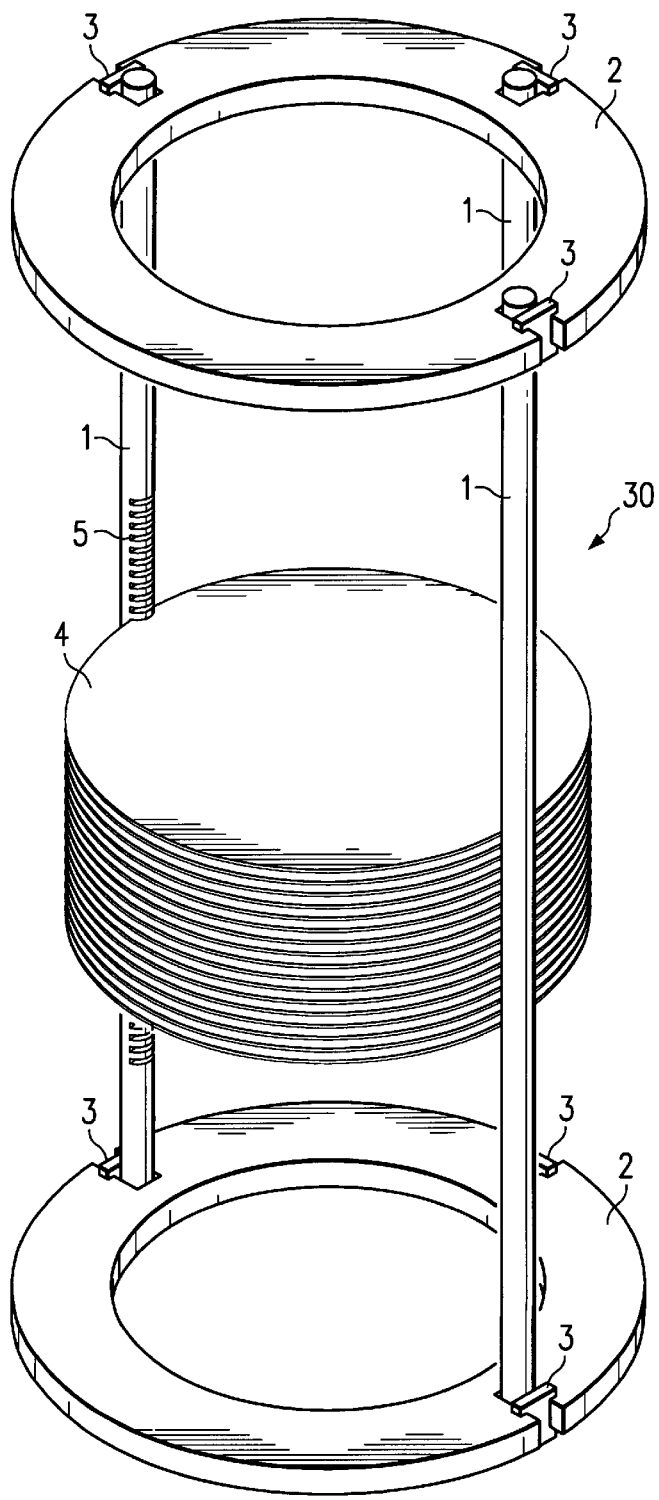
FIG. 1 is an assembly view of one embodiment of the present invention in a vertical furnace application. Also shown is a partial load of semiconductor wafers in the carrier/boat.

Referring to FIG. 1, wafer carrier or boat 30 is shown in perspective view. Wafer boat 30 is a vertically structured with the wafers 4 being inserted horizontally into the boat. In another embodiment, wafer boat 30 may be oriented horizontally and thus wafers 4 would be inserted vertically. Both configurations are within the scope of the present invention. Wafer boat 30 is then used as a carrier for the wafers during various integrated circuit fabrications steps, such as annealing in a furnace. The use of prior boats in integrated circuit fabrication is well known in the art. The present embodiment may be usefully applied in any circumstance where a prior boat was used.

Wafer boat 30 consists of a number of vertical rods 1 held together at each end by an endplates 2 and wedges 3. In the shown embodiment, three rods 1 are used. Any number of rods 1 greater than two may be used. However, three rods 1 as shown in FIG. 1 is the preferred embodiment. Also shown is a partial load of wafers 4 that fit into the slots on the rails 5.

Silicon rods 1 are formed using crystal pulling techniques similar to those used for forming semiconductor wafers 4. However, because none of the components in wafer boat 30 must be pure crystals, less expensive processing may be utilized. Similarly, endplates 2 are formed from a large silicon boule. Slices of this large boule are taken perpendicularly to the major axis of the boule. The final shapes of rods 1, endplates 2 and wedges 3 are formed using well known machining techniques.

Figure 2:
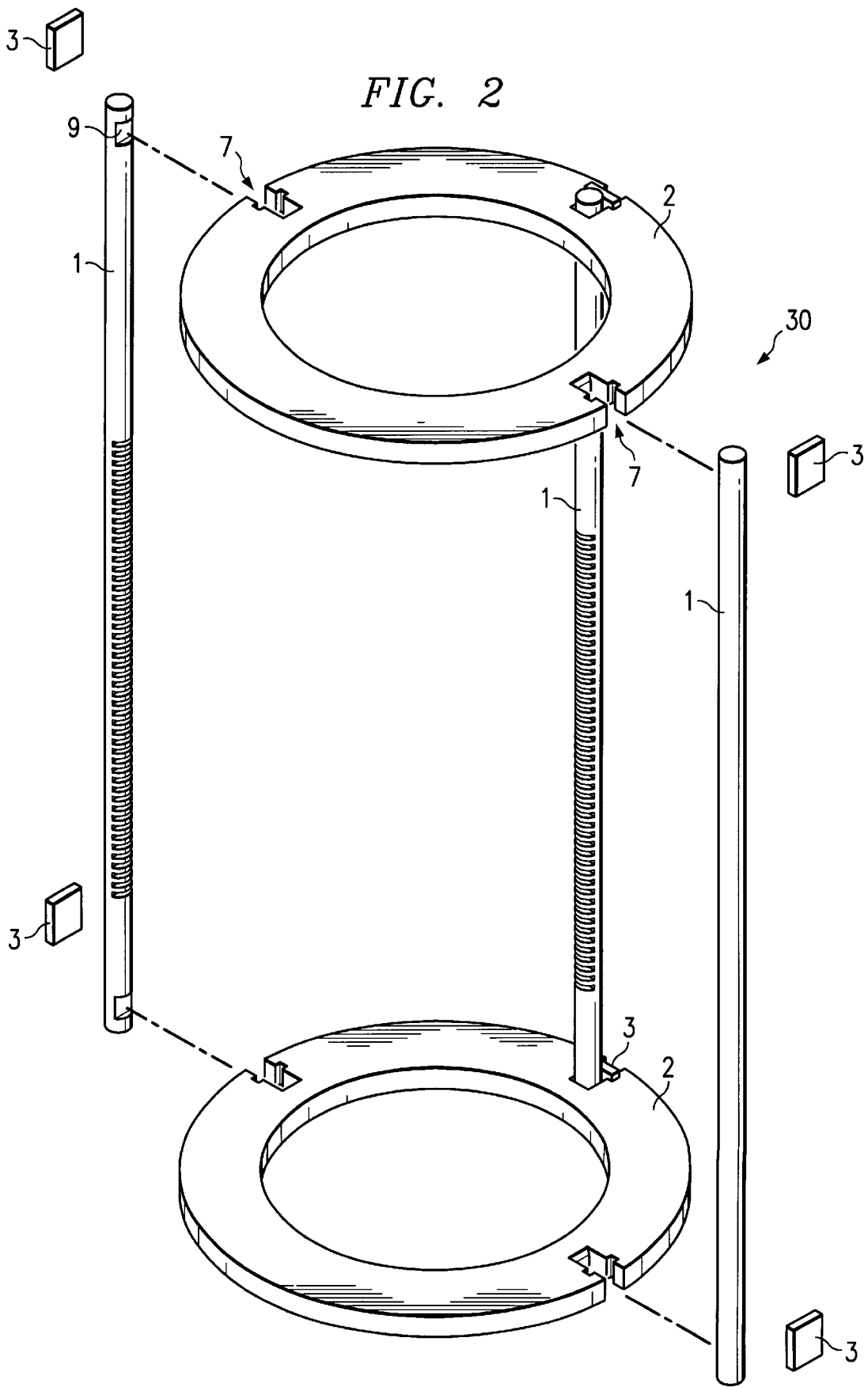
FIG. 2 is an exploded assembly view of an embodiment of the present invention showing the general assembly procedure.

FIG. 2 shows an exploded view of the wafer boat 30. A number of vertical rods 1 fit into slots 7 on the endplate 2. A notch 9 is cut into both ends of the rod 1. Notch 9 engages the inner portion of slot 7 to provide alignment and rigidity for wafer boat 30.

Because wafer boat 30 is held together mechanically, unlike prior art wafer boats, components of wafer boat 30 may be replaced. For example, if one of rods 1 becomes chipped, the wedges 3 locking it into slot 7 in both endplates 2 may be removed, thus allowing removal of the damaged rod 1. A replacement rod 1 is then inserted into slots 7 and wedges 3 inserted to lock the new rod 1 in place.

Figure 3:
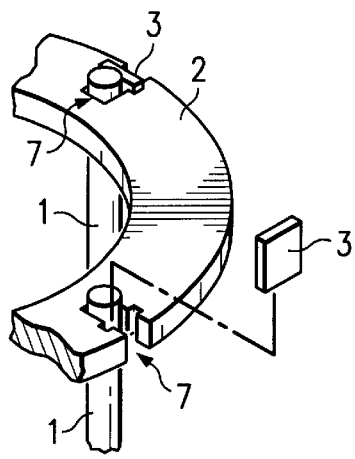
FIG. 3 is an enlarged perspective view of the area where the vertical rods interface with the end plate in the embodiment of FIG. 2 and shows how the wedge is installed into the carrier/boat to push the rod into the plate.

Referring to FIG. 3, this enlarged view shows the rod 1 in place in the endplate 2. The wedge 3 is then fitted into the angular slot 13. This forces the rod 1 into endplate 2 and forms a rigid structure.

Figure 4:
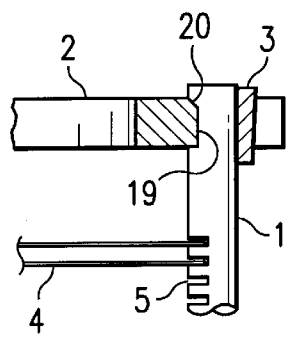
FIG. 4 is a cross-section view of the interface of the rod 1 and plate 2 and wedge 3.

FIG. 4 shows an enlarged cross-section of the interface between rod 1, endplate 2, and wedge 3. Slots 9 on the rods and endplate 2 are also shown engaged. The interface between the rod 1 and endplate 2 consists of a flat area 19 and an angled wedging surface 20 that captures the rod firmly.

To provide additional strength, a layer of polysilicon may be deposited overall on wafer boat 30 (FIG. 1) after assembly. This can be accomplished using known techniques such as chemical vapor deposition using the precipitation of silane.

Many advantages are achieved by the present invention. Contamination due to outgassing of contaminates and to different materials in the process areas is eliminated. Also, polysilicon is also much more stable at temperature and does not flow at elevated temperatures. Because wafer boat 30 is the same material as the wafers 4, it can used at higher temperatures (as high as the wafers themselves can withstand) and for longer periods of time. Also, because wafer boat 30 has the same coefficient of expansion as the wafers 4, the expansion induced stresses on both wafer boat 30 and wafers 4 is minimized.

Although the invention has been described in terms of a preferred embodiment using preferred materials, those skilled in the art will recognize that the invention can be practiced, with modification, using other materials, such as germanium and gallium arsenide. These modifications are within the spirit and scope of the appended claims. Moreover, the inventive wafer boat and fabrication technique should be useful in many environments.

Having thus described our invention, what we claim as new and desire to secure by letters patent is set forth in the following claims.

What is claimed is:

1. A wafer carrier for holding in place a plurality of wafers comprising:
   a first end piece formed of the same material as said wafers;
   a second end piece formed of the same material as said wafers; and
   a plurality of connecting pieces extending between said first end piece and said second end piece, said connecting pieces being of the same material as said wafers, wherein said plurality of connecting pieces is held in place on said first and second end pieces by a wedge inserted beside said connecting pieces where said connecting pieces extend through said first and second end pieces.

2. A wafer carrier as in claim 1 wherein said material is germanium.

3. A wafer carrier as in claim 1 wherein said material is gallium arsenide.

4. A wafer carrier for holding wafers during a manufacturing process comprising:
   a first end piece having a plurality of slots formed therein;
   a second end piece having a plurality of slots formed therein;
   a plurality of connecting pieces being adapted to fit in said slots of said first and second end pieces and being inserted into said slots; and
   a plurality of wedges inserted in said first and second end pieces adjacent to said connecting pieces thereby holding said connecting pieces in place.

5. A wafer carrier as in claim 4 further comprising at least two notches formed in each connecting piece, said notches in said connecting pieces being adapted to engage said first and second end pieces when said connecting pieces are inserted in said slots in said first and second end pieces.

6. A wafer carrier as in claim 4 wherein at least a part of the surface of said notches is formed at an angle relative to a corner of said notch such that said surface has a wedging effect when said notch engages said first or second end piece.

7. A wafer carrier as in claim 4 further comprising a plurality of slots in said connecting pieces positioned to hold in place a plurality of said wafers.

8. A wafer carrier as in claim 4 wherein said wafer carrier is made of silicon.

9. A wafer carrier as in claim 4 wherein said wafer carrier is made of polysilicon.

10. A method for forming a wafer carrier for holding wafers during a manufacturing process comprising:
    providing a first end piece having a plurality of slots formed therein;
    providing a second end piece having a plurality of slots formed therein;
    providing a plurality of connecting pieces being adapted to fit in said slots of said first and second end pieces;
    inserting said connecting pieces into said slots; and
    inserting a plurality of wedges into said first and second end pieces adjacent to said connecting pieces thereby holding said connecting pieces firmly in place.

11. A method for wafer carrier as in claim 10 further comprising forming at least two notches formed in each connecting piece, said notches in said connecting pieces being adapted to engage said first and second end pieces when said connecting pieces are inserted in said slots in said first and second end pieces.

12. A method for forming a wafer carrier as in claim 10 wherein at least a part of the surface of said notches is formed at an angle relative to a corner of said notch such that said surface has a wedging effect when said notch engages said first or second end piece.

13. A wafer carrier as in claim 10 further comprising forming a plurality of slots in said connecting pieces positioned to hold in place a plurality of said wafers.

14. A wafer carrier as in claim 10 wherein said first and second end pieces, said connecting pieces and said wedges are formed out of silicon.

15. A method for repairing a wafer carrier for holding wafers during a manufacturing process, the wafer carrier including:

a first end piece having a plurality of slots formed therein;

a second end piece having a plurality of slots formed therein;

a plurality of connecting pieces being adapted to fit in said slots of said first and second end pieces;

a plurality of wedges into said first and second end pieces adjacent to said connecting pieces thereby holding said connecting pieces firmly in place; the method comprising:

removing the wedges holding a damaged component in place;

replacing said damaged component with a replacement component; and re-inserting said wedges to lock the replacement component in place.

* * * * *